(12) United States Patent
Fan

(10) Patent No.: US 8,344,804 B2
(45) Date of Patent: Jan. 1, 2013

(54) COMMON-MODE FEEDBACK CIRCUIT

(75) Inventor: Fangping Fan, Chengdu (CN)

(73) Assignee: IPGlobal Microelectronics (SiChuan) Co., Ltd., Chengdu, Sichuan Province (CN)

( * ) Notice: Subject to any disclaimer, the term of this patent is extended or adjusted under 35 U.S.C. 154(b) by 0 days.

(21) Appl. No.: 13/105,875

(22) Filed: May 11, 2011

(65) Prior Publication Data

US 2011/0279181 A1 Nov. 17, 2011

(30) Foreign Application Priority Data

May 12, 2010 (CN) .......................... 2010 1 0170396

(51) Int. Cl.
*H03F 3/45* (2006.01)
(52) U.S. Cl. ........................................ 330/258; 330/261
(58) Field of Classification Search .................. 330/253, 330/257, 258, 260, 261
See application file for complete search history.

(56) References Cited

U.S. PATENT DOCUMENTS

| 7,170,347 | B1 * | 1/2007 | Kindt | 330/253 |
| 7,265,621 | B1 * | 9/2007 | Min | 330/253 |
| 7,453,319 | B2 * | 11/2008 | Gupta et al. | 330/258 |
| 8,072,268 | B2 * | 12/2011 | Murakami | 330/253 |

* cited by examiner

*Primary Examiner* — Henry Choe

(57) ABSTRACT

A common-mode feedback circuit includes an amplifying circuit, a biasing circuit connected with the amplifying circuit, and a feedback loop connecting the amplifying circuit with the biasing circuit. The feedback loop includes a first field effect transistor M1, a eighth field effect transistor M1B connected with the first field effect transistor M1, a tenth field effect transistor M2B and an eleventh field effect transistor MFB connecting the eighth field effect transistor M1B and the tenth field effect transistor M2B. The common-mode voltage value of the common-mode feedback circuit is adjusted by the eleventh field effect transistor MFB. The common-mode feedback circuit has the simple structure and is capable of achieving the common-mode feedback without the peripheral feedback circuit and the input reference voltage.

15 Claims, 1 Drawing Sheet

COMMON-MODE FEEDBACK CIRCUIT

BACKGROUND OF THE PRESENT INVENTION

1. Field of Invention

The present invention relates to a feedback circuit, and more particularly to a common-mode feedback circuit.

2. Description of Related Arts

The common-mode feedback circuit is usually used to stabilize the common-mode voltage of the fully differential analog circuit. The differential current which is generated by comparing the average of two differential output voltages with the common-mode reference voltage is fed back to adjust the common-mode voltage.

Referring to FIG. 1 of the drawings, an existing common-mode feedback circuit is illustrated, wherein the circuit comprises a power supply VDD, a ground GND, two input ends Vin+ and Vin−, two output ends Vout1 and Vout2, two resistors R, five field effect transistors M11, M12, M13, M14 and M15, and an operational amplifier.

The circuit detects an output common-mode voltage Vcm by the two resistors R, and compares the output common-mode voltage Vcm with an input reference voltage Vref by the operational amplifier. Vcm is forced to be equal to Vref. The operational amplifier outputs the feedback to the field effect transistor M13 for adjusting the current passing through the transistor M13 equal to the sum of the current passing through the transistor M11 and the current passing through the transistor M12, thus achieving the common-mode feedback.

However, the existing circuit which is capable of achieving the common-mode feedback occupies a large silicon area, which goes against integrating. Furthermore, the existing circuit increases the output load, thereby decreasing the gain.

SUMMARY OF THE PRESENT INVENTION

An object of the present invention is to provide a common-mode feedback circuit which is capable of achieving the common-mode feedback without the peripheral feedback circuit and the input reference voltage.

Accordingly, in order to accomplish the above object, the present invention provides a common-mode feedback circuit, comprising:

an amplifying circuit;

a biasing circuit connected with the amplifying circuit; and a feedback circuit connecting the amplifying circuit with the biasing circuit, wherein the feedback circuit comprises a first field effect transistor, a eighth field effect transistor connected with the first field effect transistor, a tenth field effect transistor and an eleventh field effect transistor connecting the eighth field effect transistor and the tenth field effect transistor, wherein a common-mode voltage value is adjusted by the eleventh field effect transistor.

Compared with the prior art, the common-mode feedback circuit of the present invention has a simple structure. It can achieve the common-mode feedback without the peripheral feedback circuit and the input reference voltage.

These and other objectives, features, and advantages of the present invention will become apparent from the following detailed description, the accompanying drawings, and the appended claims.

DETAILED DESCRIPTION OF THE PREFERRED EMBODIMENT

Figure 1:
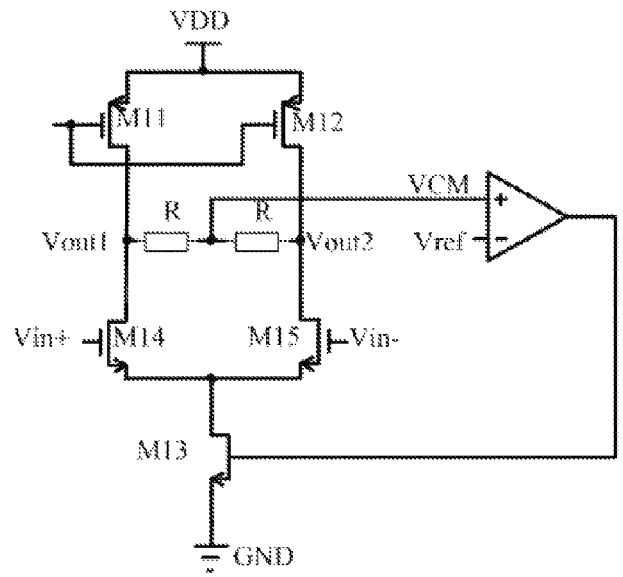
FIG. 1 is a circuit diagram of a traditional common-mode feedback circuit.
Figure 2:
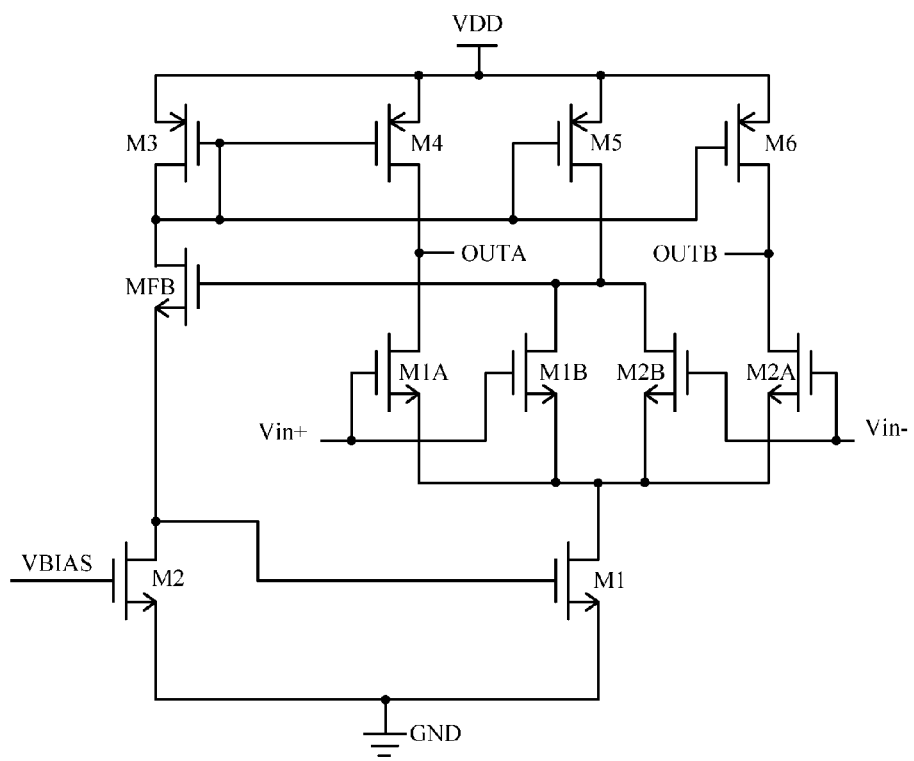
FIG. 2 is a circuit diagram of a common-mode feedback circuit according to a preferred embodiment of the present invention.

Referring to FIG. 2 of the drawings, a common-mode feedback circuit according to a preferred embodiment of the present invention is illustrated, wherein the common-mode feedback circuit comprises a first field effect transistor (FET) M1, a second field effect transistor M2, a third field effect transistor M3, a fourth field effect transistor M4, a fifth field effect transistor M5, a sixth field effect transistor M6, a seventh field effect transistor M1A, an eighth field effect transistor M1B, a ninth field effect transistor M2A, a tenth field effect transistor M2B, an eleventh field effect transistor MFB, two input ends Vin+ and Vin−, and two output ends OUTA and OUTB. The first FET M1, the fourth FET M4, the sixth FET M6, the seventh FET M1A and the ninth FET M2A form an amplifying circuit. The first FET M1, the second FET M2, the third FET M3, the fourth FET M4, the fifth FET M5 and the sixth FET M6 form a biasing circuit for setting the working environment. The first FET M1, the eighth FET M1B, the tenth FET M2B and the eleventh FET MFB form a feedback circuit.

The specific connection relations of the common-mode feedback circuit of the present invention are described as follows. The grid electrode of the first FET M1 is connected with the drain electrode of the second FET M2. The source electrode of the first FET M1 and the source electrode of the second FET M2 are connected with the ground GND. The drain electrode of the first FET M1, the source electrode of the eighth FET M1B, the source electrode of the tenth FET M2B, the source electrode of the seventh FET M1A are connected with the source electrode of the ninth FET M2A. The grid electrodes of the eighth FET M1B and the tenth FET M2B are respectively connected with two input ends Vin+ and Vin−. The grid electrodes of the seventh FET M1A and the ninth FET M2A are respectively connected with two input ends Vin+ and Vin−. The drain electrodes of the eighth FET M1B and the tenth FET M2B are connected with the drain electrode of the fifth FET M5. The drain electrodes of the seventh FET M1A and the ninth FET M2A are respectively connected with two output ends OUTA and OUTB. The grid electrode of the eleventh FET MFB is connected with the drain electrode of the fifth FET M5. The source electrode of the eleventh FET MFB is connected with the drain electrode of the second FET M2. The drain electrode of the eleventh FET MFB is connected with the drain electrode of the third FET M3. The source electrode of the third FET M3, the source electrode of the fourth FET M4, the source electrode of the fifth FET M5, and the source electrode of the sixth FET M6 are connected the power supply VDD. The grid electrode of the third FET M3, the grid electrode of the fourth FET M4, and the grid electrode of the fifth FET M5 are connected with the grid electrode of the sixth FET M6. The drain electrode of the fourth FET M4 is connected with the output end OUTA. The drain electrode of the sixth FET M6 is connected with the output end OUTB. The grid electrode of the second FET M2 is connected with the bias voltage VBIAS. The grid electrode of the third FET M3 is connected with the drain electrode thereof.

As shown in FIG. 2, the first FET M1, the second FET M2, the seventh FET M1A, the eighth FET M1B, the ninth FET M2A, the tenth FET M2B and the eleventh FET MFB are N-type FETs (NMOS), the third FET M3, the fourth FET M4, the fifth FET M5 and the sixth FET M6 are P-type FETs (PMOS). Here, the N-type FETs (NMOS) can be replaced by the P-type FETs (PMOS), and the P-type FETs (PMOS) can be replaced by the N-type FETs (NMOS). Also, these FETs can be replaced by other switching components or circuits which are capable of achieving the same function as required.

Compared with the traditional common-mode feedback circuit, the common-mode feedback circuit of the present invention can achieve the common-mode feedback without the peripheral feedback circuit. The feedback circuit of the common-mode feedback circuit of the present invention includes MFB, M1, M1B and M2B. The common-mode voltage value of the common-mode feedback circuit of the present invention can be adjusted by the FET MFB. Detailed analyses are as follows.

1) The Common-Mode Voltage

If the current passing through the FET M2 is defined as I, the mirror current passing through each of the FETs M4, M5 and M6 is 2I, the width to length ratio of the FET M1A (M2A) is twice that of the FET M1B (M2B), so as to ensure that the quiescent operating points of the input transistors are same. The current passing through the FET M1 is 6I, so the grid voltage thereof is obtained by a formula of:

$$Vg1=Vthn+sqrt(6I/(\mu nCox(W/L)1))$$

The current passing through the FET MFB is I, so the grid voltage thereof is obtained by a formula of:

$$Vmfb=Vthn'+Vg1+sqrt(I/(\mu nCox(W/L)fb))=Vthn'+Vthn+sqrt(6I/(\mu nCox(W/L)1))+sqrt(I/(\mu nCox(W/L)fb))$$

In general, we choose (W/L)fb>>(W/L)1.

Accordingly, sqrt(6I/($\mu$nCox(W/L)1))>>sqrt(I/($\mu$nCox(W/L)fb))

Therefore, Vmfb≈Vthn'+Vthn+sqrt(6I/($\mu$nCox(W/L)1))

Here, Vthn' is the threshold voltage considering the substrate bias effect. The common-mode voltage is higher at this time. If the input transistors are PMOS transistors, the common-mode voltage can be reduced to 2Vthn+sqrt(6I/($\mu$pCox(W/L)1)).

Vthn' and Vthn are affected by the process, and $\mu$nCox also varies with the process, so they can provide the certain self-compensation for the quiescent voltage value and the temperature coefficient of Vmfb. Furthermore, the appropriate bias current is selected to provide a better compensation, such that Vmfb has a smaller change when temperature and process vary. It is seen that the common-mode feedback circuit of the present invention can obtain the stable common-mode voltage value.

Here, Vthn denotes the threshold voltage of NMOS, $\mu$n denotes the electron mobility, Cox denotes the gate oxide capacitance per unit area, (W/L)1 denotes the width to length ratio of the first FET M1, Vthn' denotes the threshold voltage of NMOS with the substrate bias effect, (W/L)fb denotes the width to length ratio of the eleventh FET MFB.

2) The Common-Mode Feedback Gain

The feedback circuit of the common-mode feedback circuit of the present invention comprises M1B, M2B, MFB and M1. Its gain can be expressed as below.

$$Acm=gm1*ro5*gmfb*ro2/(1+(gmfb+gmfbb)ro2)$$
$$\approx gm1*ro5$$

Here, gm1 denotes the transconductance of the first FET M1, ro5 denotes the small-signal resistance of the fifth FET M5, gmfb denotes the transconductance of the eleventh FET MFB, ro2 denotes the small-signal resistance of the second FET M2, gmfbb denotes the transconductance of the eleventh FET MFB with the substrate bias effect.

The common-mode feedback circuit of the present invention has the simple structure. It can achieve the common-mode feedback without the peripheral feedback circuit and the input reference voltage.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A common-mode feedback circuit, comprising:
an amplifying circuit;
a biasing circuit connected with said amplifying circuit; and
a feedback loop connecting said amplifying circuit with said biasing circuit, wherein said feedback loop comprises a first field effect transistor, a eighth field effect transistor connected with said first field effect transistor, a tenth field effect transistor and an eleventh field effect transistor connecting said eighth field effect transistor and said tenth field effect transistor, wherein a common-mode voltage value is adjusted by said eleventh field effect transistor,
wherein a grid electrode of said first field effect transistor is connected with a source electrode of said eleventh field effect transistor, a drain electrode of said first field effect transistor is connected with a source electrode of said eighth field effect transistor and a source electrode of said tenth field effect transistor, a source electrode of said first field effect transistor is connected with ground.

2. The common-mode feedback circuit, as recited in claim 1, wherein a grid electrode of said eighth field effect transistor and a grid electrode of said tenth field effect transistor are respectively connected with two input ends, a drain electrode of said eighth field effect transistor and a drain electrode of said tenth field effect transistor are connected with a grid electrode of said eleventh field effect transistor.

3. A common-mode feedback circuit, comprising:
an amplifying circuit;
a biasing circuit connected with said amplifying circuit; and
a feedback loop connecting said amplifying circuit with said biasing circuit, wherein said feedback loop comprises a first field effect transistor, a eighth field effect transistor connected with said first field effect transistor, a tenth field effect transistor and an eleventh field effect transistor connecting said eighth field effect transistor and said tenth field effect transistor, wherein a common-mode voltage value is adjusted by said eleventh field effect transistor,
wherein said amplifying circuit comprises a first field effect transistor, a fourth field effect transistor, a sixth field effect transistor connecting with said fourth field effect transistor, a seventh field effect transistor connecting with said fourth field effect transistor and a ninth field effect transistor connected with said sixth field effect transistor,
wherein a grid electrode of said seventh field effect transistor and a grid electrode of said eighth field effect transistor are connected with a first input end, a grid electrode of said ninth field effect transistor and a grid electrode of said tenth field effect transistor are connected with a second input end.

4. The common-mode feedback circuit, as recited in claim 3, wherein a source electrode of said seventh field effect transistor, a source electrode of said eighth field effect transistor, a source electrode of said ninth field effect transistor and a source electrode of said tenth field effect transistor are connected with a drain electrode of said first field effect transistor, a drain electrode of said seventh field effect transistor and a drain electrode of said ninth field effect transistor are respectively connected with two output ends.

5. A common-mode feedback circuit, comprising:
an amplifying circuit;
a biasing circuit connected with said amplifying circuit; and
a feedback loop connecting said amplifying circuit with said biasing circuit, wherein said feedback loop comprises a first field effect transistor, a eighth field effect transistor connected with said first field effect transistor, a tenth field effect transistor and an eleventh field effect transistor connecting said eighth field effect transistor and said tenth field effect transistor, wherein a common-mode voltage value is adjusted by said eleventh field effect transistor,
wherein said biasing circuit comprises a first field effect transistor, a second field effect transistor connected with said first field effect transistor, a third field effect transistor connected with said second field effect transistor, a fourth field effect transistor connected with said third field effect transistor, a fifth field effect transistor and a sixth field effect transistor connected with said fifth field effect transistor,
wherein a grid electrode of said first field effect transistor is connected with a drain electrode of said second field effect transistor, a source electrode of said first field effect transistor is connected with a source electrode of said second field effect transistor, a grid electrode of said second field effect transistor inputs a bias voltage.

6. The common-mode feedback circuit, as recited in claim 5, wherein a grid electrode of said third field effect transistor, a grid electrode of said fourth field effect transistor, a grid electrode of said fifth field effect transistor and a grid electrode of said sixth field effect transistor are connected with a drain electrode of said eleventh field effect transistor, wherein a source electrode of said third field effect transistor, a source electrode of said fourth field effect transistor, a source electrode of said fifth field effect transistor and a source electrode of said sixth field effect transistor are connected with a power supply.

7. The common-mode feedback circuit, as recited in claim 6, wherein a grid electrode of said eleventh field effect transistor is connected with a drain electrode of said fifth field effect transistor, a source electrode of said eleventh field effect transistor is connected with a drain electrode of said second field effect transistor.

8. The common-mode feedback circuit, as recited in claim 3, wherein said first, seventh, eighth, ninth and tenth field effect transistors are NMOS transistors, said fourth and sixth field effect transistors are PMOS transistors.

9. The common-mode feedback circuit, as recited in claim 4, wherein said first, seventh, eighth, ninth and tenth field effect transistors are NMOS transistors, said fourth and sixth field effect transistors are PMOS transistors.

10. The common-mode feedback circuit, as recited in claim 5, wherein said first, second, eighth, tenth and eleventh field effect transistors are NMOS transistors, said third, fourth, fifth and sixth field effect transistors are PMOS transistors.

11. The common-mode feedback circuit, as recited in claim 6, wherein said first, second, eighth, tenth and eleventh field effect transistors are NMOS transistors, said third, fourth, fifth and sixth field effect transistors are PMOS transistors.

12. The common-mode feedback circuit, as recited in claim 7, wherein said first, second, eighth, tenth and eleventh field effect transistors are NMOS transistors, said third, fourth, fifth and sixth field effect transistors are PMOS transistors.

13. A common-mode feedback circuit, comprising a first field effect transistor, a second field effect transistor, a third field effect transistor, a fourth field effect transistor, a fifth field effect transistor, a sixth field effect transistor, a seventh field effect transistor, an eighth field effect transistor, a ninth field effect transistor, a tenth field effect transistor, an eleventh field effect transistor, a first and second input ends, and two output ends,
wherein said first field effect transistor, said fourth field effect transistor, said sixth field effect transistor, said seventh field effect transistor and said ninth field effect transistor form an amplifying circuit; said first field effect transistor, said second field effect transistor, said third field effect transistor, said fourth field effect transistor, said fifth field effect transistor and a sixth field effect transistor form a biasing circuit for setting a working environment; said first field effect transistor, said eighth field effect transistor, said tenth field effect transistor and said eleventh field effect transistor form a feedback loop,
wherein a grid electrode of said first field effect transistor is connected with a drain electrode of said second field effect transistor; a source electrode of said first field effect transistor and a source electrode of said second field effect transistor are connected with ground; a source electrode of said seventh field effect transistor, a source electrode of said eighth field effect transistor, a source electrode of said ninth field effect transistor and a source electrode of said tenth field effect transistor are connected with a drain electrode of said first field effect transistor; a drain electrode of said second field effect transistor is connected with a source electrode of said eleventh field effect transistor; a grid electrode of said seventh field effect transistor and a grid electrode of said eighth field effect transistor are connected with said first input end; a grid electrode of said ninth field effect transistor and a grid electrode of said tenth field effect transistor are connected with said second input end; a drain electrode of said eighth field effect transistor, a drain electrode of said tenth field effect transistor and a drain electrode of said fifth field effect transistor are connected with a grid electrode of said eleventh field effect transistor; a drain electrode of said seventh field effect transistor and a drain electrode of said ninth field effect transistor are respectively connected with said two output ends; a drain electrode of said third field effect transistor, a grid electrode of said third field effect transistor, a grid electrode of said fourth field effect transistor, a grid electrode of said fifth field effect transistor, and a grid electrode of said sixth field effect transistor are connected with a drain electrode of said eleventh field effect transistor; a drain electrode of said fourth field effect transistor is connected with said drain electrode of said seventh field effect transistor; a drain electrode of said sixth field effect transistor is connected with said drain electrode of said ninth field effect transistor; a source electrode of said third field effect transistor, a source electrode of said fourth field effect transistor, a source electrode of said fifth field effect transistor and a source electrode of said sixth field effect transistor are connected with a power supply; a grid electrode of said second field effect transistor inputs a bias voltage.

14. The common-mode feedback circuit, as recited in claim 13, wherein said first, second, seventh, eighth, ninth, tenth and eleventh field effect transistors are NMOS transistors, said third, fourth, fifth and sixth field effect transistors are PMOS transistors.

15. The common-mode feedback circuit, as recited in claim 13, wherein said first, second, seventh, eighth, ninth, tenth and eleventh field effect transistors are PMOS transistors, said third, fourth, fifth and sixth field effect transistors are NMOS transistors.

* * * * *